(12) United States Patent
Delfyett et al.

(10) Patent No.: US 10,326,251 B2
(45) Date of Patent: Jun. 18, 2019

(54) ULTRA-LOW NOISE MODE-LOCKED LASER, METHODS, AND APPLICATIONS

(71) Applicant: UNIVERSITY OF CENTRAL FLORIDA RESEARCH FOUNDATION, INC., Orlando, FL (US)

(72) Inventors: Peter Delfyett, Chuluota, FL (US); Anthony Klee, Orlando, FL (US); Kristina Bagnell, Orlando, FL (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 196 days.

(21) Appl. No.: 15/175,600

(22) Filed: Jun. 7, 2016

(65) Prior Publication Data

US 2018/0115136 A1 Apr. 26, 2018

Related U.S. Application Data

(60) Provisional application No. 62/172,488, filed on Jun. 8, 2015.

(51) Int. Cl.
*H01S 3/11* (2006.01)
*H01S 3/08* (2006.01)
(Continued)

(52) U.S. Cl.
CPC ........ *H01S 3/1121* (2013.01); *H01S 3/08013* (2013.01); *H01S 3/1062* (2013.01); *H01S 3/1109* (2013.01); *H01S 3/1115* (2013.01); *H01S 3/1118* (2013.01); *H01S 3/1305* (2013.01); *H01S 3/137* (2013.01); (Continued)

(58) Field of Classification Search
CPC ...... H01S 3/1121; H01S 3/1118; H01S 5/141; H01S 3/1305; H01S 3/08013; H01S 3/137; H01S 3/1109; H01S 3/1062; H01S 3/1115; H01S 2301/02; H01S 5/0092; H01S 3/107
See application file for complete search history.

(56) References Cited

U.S. PATENT DOCUMENTS

| | | | | |
|---|---|---|---|---|
| 7,697,579 B1 * | 4/2010 | Delfyett | ................ | H01S 3/1109 372/18 |
| 2015/0236784 A1 * | 8/2015 | Vahala | ..................... | H03L 7/08 398/115 |

* cited by examiner

*Primary Examiner* — Xinning(Tom) Niu
(74) *Attorney, Agent, or Firm* — Bond Schoeneck & King, PLLC; George McGuire

(57) ABSTRACT

A mode-locked laser (MLL) that produces ultra-low phase noise optical and RF outputs, includes two nested resonant optical cavities including an optical fiber-based cavity and an etalon, and a three bandwidth Pound-Drever-Hall (PDH) frequency stabilizer assembly incorporating three different optical bandpass filters. The optical fiber-based cavity is characterized by a free spectral range, $FSR_{fiber}$, and the etalon is characterized by a free spectral range, $FSR_{filter}$, wherein $FSR_{filter}/FSR_{fiber}$ is an integer equal to or greater than 2. A method of generating ultra-low phase noise optical and RF outputs is disclosed. Optical and RF outputs have a phase noise that is less than −100 dBc/Hz at 1 Hz and less than −150 dBc at 10 KHz.

17 Claims, 8 Drawing Sheets

(51) Int. Cl.
  *H01S 3/13* (2006.01)
  *H01S 3/106* (2006.01)
  *H01S 3/137* (2006.01)
  *H01S 5/14* (2006.01)
  H01S 3/107 (2006.01)
  H01S 5/00 (2006.01)
(52) U.S. Cl.
  CPC .............. *H01S 5/141* (2013.01); *H01S 3/107* (2013.01); *H01S 5/0092* (2013.01); *H01S 2301/02* (2013.01)

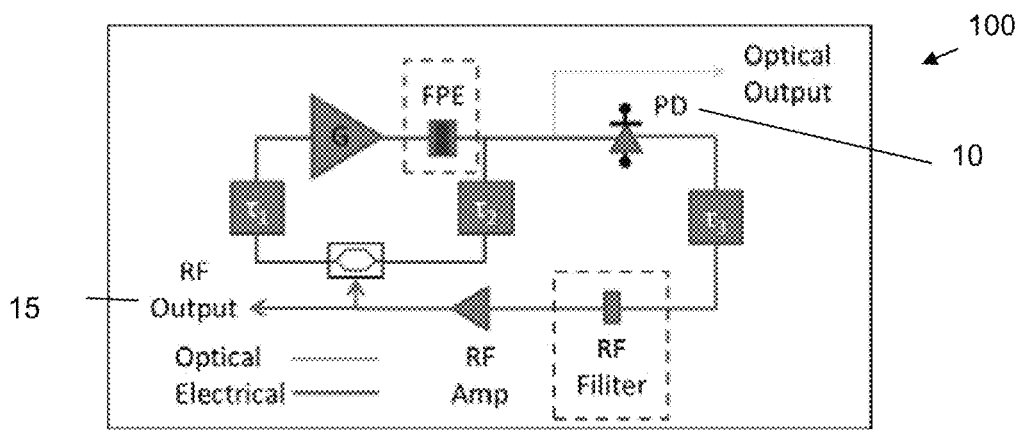
FIG. 1
(PRIOR ART)
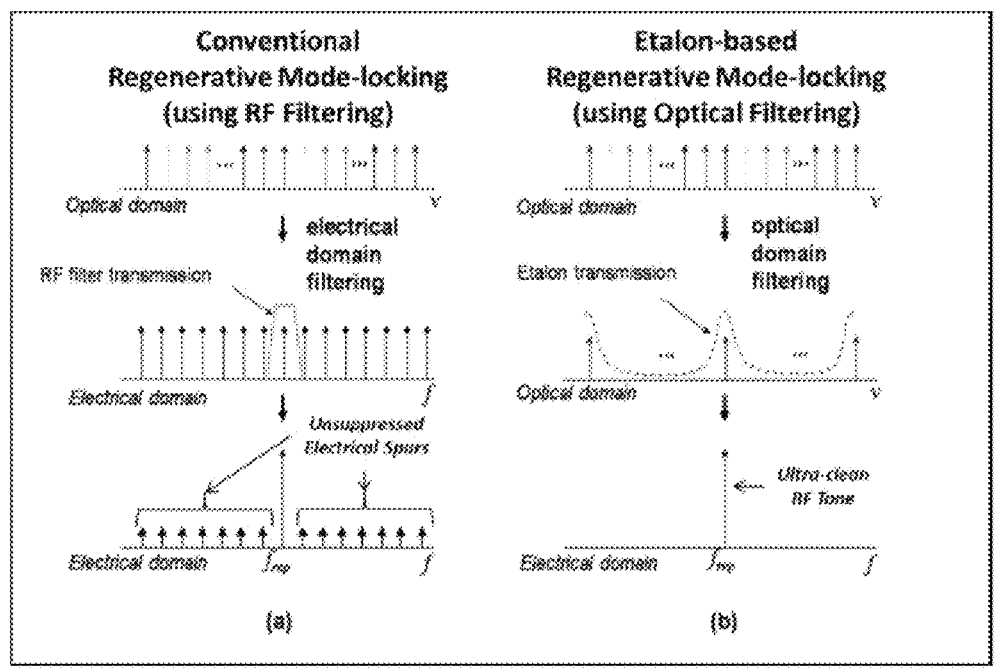
FIG. 2A                    FIG. 2B

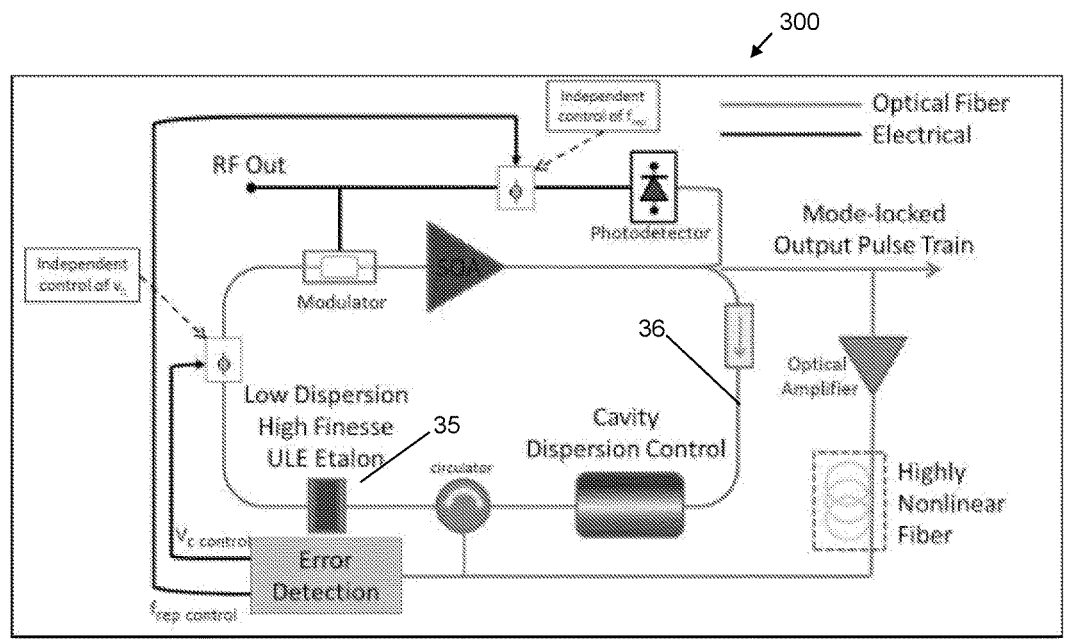
FIG. 3
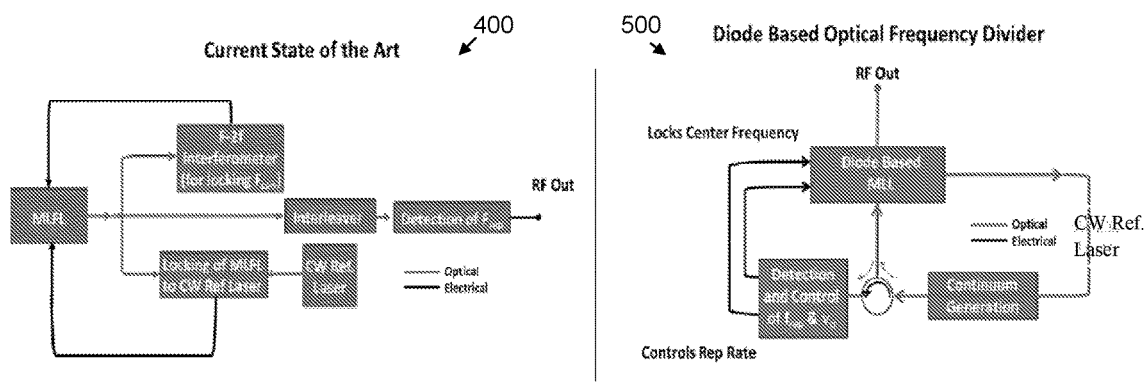
FIG. 4
FIG. 5

Comb spectrum

Intensity autocorrelation linewidth frequency drift

ULTRA-LOW NOISE MODE-LOCKED LASER, METHODS, AND APPLICATIONS

RELATED APPLICATION DATA

The instant application claims priority from U.S. Provisional Application No. 62/172,488 filed Jun. 8, 2015, the subject matter of which is incorporated herein by reference in its entirety.

GOVERNMENT FUNDING

This invention was made with government support under contract number N66001-14-C-4005 awarded by DARPA. The government has certain rights in the invention.

BACKGROUND

Field of the Invention

Aspects and embodiments pertain to a mode-locked laser (MLL) that produces that produces ultra-low phase noise optical and RF outputs, methods for generating ultra-low phase noise optical and RF outputs, and applications thereof. More particular aspects and embodiments pertain to a MLL comprising a nested cavity architecture that enables control of the center frequency of the optical output spectrum of the MLL independent of a change of the repetition rate of the optical output spectrum of the MLL and control of the repetition rate of the optical output spectrum of the MLL independent of a change of the center frequency of the optical output spectrum of the MLL, associated methods, and applications thereof.

The instant application is related to, and is an improvement upon, U.S. Pat. No. 7,697,579 entitled Optical frequency self stabilization in a coupled optoelectronic oscillator. The '579 patent describes the then current state of the art method to generate an extremely low phase noise 10 GHz pulse train with using a technique called 'optical frequency division'. The disclosed optical frequency divider was comprised of four major key components: 1) a mode-locked laser, 2) a separate CW laser, 3) a nonlinear f-2f interferometer, and 4) an optical pulse train interleaver.

The inventors' previous work in nested optical cavities has shown that a mode-locked laser is capable of filtering the phase noise of the RF driving source. Conceptually, the laser acts as an electrical filter with a high quality factor, or Q value, defined as $Q=f_{res}/2\Gamma$, where $f_{res}$ is the resonant frequency of the filter and $\Gamma$ is the filter's half-width at half maximum (HWHM) bandwidth. Such a conception of a mode-locked laser as a high Q microwave component has led to dramatic reductions in both amplitude and phase noise of actively mode-locked lasers.

A conventional regenerative mode-locked laser 100 is shown in FIG. 1, with the RF source replaced by a loop consisting of a photodetector 10 illuminated by pulses from the laser cavity, a low noise electrical amplifier 11, an electrical phase shifter (not shown), and an RF filter 12 that connects back to the input of an intensity modulator. The generation of a low noise RF signal 15 and optical pulses are built from noise, and can be roughly described as follows: When the laser output is photodetected, the beat signals from different longitudinal modes are detected. One of these beat signals is selected with the RF filter, amplified, and with a properly adjusted phase, used to drive the loss modulator in the optical cavity. The modulation reinforces the strength of that particular photodetected beat signal which is amplified, drives the modulator and so on. Provided there is enough gain for the RF signal, oscillation will occur for the photodetected beat tone selected by the RF filter. The phase of the electrical signal to the modulator is set such that the modulator is at maximum transmission when the optical pulse travels through.

Just as a conventional regenerative mode-locked laser can be created by adding an optoelectronic feedback loop (see FIG. 3), an optical frequency stabilized regenerative mode-locked laser can be created by removing the RF filter in the in the photodetector loop, and placing aperiodic optical filter, in the form of, e.g., a Fabry Perot etalon 35, in the optical laser loop 36. FIGS. 2A, 2B illustrates a frequency domain picture of the difference between an intracavity etalon-based COEO (FIG. 2A) and a conventional COEO with an RF filter (FIG. 2B). Without the inclusion of an etalon, the laser supports modes separated by the laser cavity fundamental frequency, $f_o$. In this case the optical spectrum behaves like that of an actively harmonically mode-locked laser where multiple interleaved axial mode groups operate simultaneously. The simultaneous lasing of different optical axial mode groups prevents the existence of a single phase locked frequency comb with multi-gigahertz spacing. Placing an etalon in the laser cavity not only selects a single optical axial mode group, it eliminates spurious beat frequencies in the optoelectronic loop, rendering any RF filtering unnecessary.

An optical frequency stabilized COEO has potential advantages over its actively mode-locked counterpart. The elimination of the RF source significantly reduces the size, weight and power consumption of the comb source. Additionally, such an oscillator should not suffer from difficulties related to matching the etalon free spectral range to the frequency of an ultralow RF oscillator. Not only can the RF oscillator for mode-locking be eliminated, but it is also possible to remove the source necessary for the generation of the PDH laser frequency stabilization, by dividing down the RF output signal for use in the PDH locking scheme. This results in a semiconductor-based, completely self-contained low jitter multi-gigahertz spaced, stabilized frequency comb source 300 as illustrated in FIG. 3.

A conventional (NIST) optical frequency divider 400 is comprised of six major key components as illustrated in FIG. 4, which significantly differs from the embodied apparatus 500 and method that provide state of the art performance using a unique linear detection scheme, fewer parts, a smaller footprint, and better wall plug efficiency (FIG. 5).

The NIST frequency division factor depends on the wavelength of the CW locking reference laser that overlaps the comb spectrum. Since there must be spectral overlap between the mode-locked laser comb and CW laser, this puts limits on the wavelength of the CW laser and hence the division factor (see FIG. 6), whereas in the embodied apparatus and method the division factor is limited only by the continuum bandwidth (FIG. 7).

The repetition rate of the NIST laser is ~160 MHz, while the desired RF tone is ~8 GHz. To better realize the low noise property of the NIST generated RF tone, a time-domain interleaver is used to increase the pulse repetition frequency to 8 GHz. While this does increase the RF power at 8 GHz, the interleaving process creates large RF spurs at 160 MHz and all harmonics (see FIG. 8). These 'supermode' or 'interleaver' spurs completely dominate the performance of the RF tone, making it useful only for applications with <160 MHz of instantaneous bandwidth. Future DARPA applications need the RF bandwidth to Nyquist (5 GHz). One could consider using a filter to suppress the spurs, but the filter characteristics would necessitate >140 dB suppression without any insertion loss, which does not appear feasible given current state of the art technology in RF filtering. In contrast (and described in detail below) the embodied apparatus and method provide an RF tone (e.g., 10 GHz) that is equal to the fundamental mode-locked laser repetition rate; thus, all of the RF power is contained in this tone, which is spur-free, allowing the embodied source to be used in applications with signal processing bandwidth requirements out to the Nyquist frequency (FIG. 9).

Optical frequency combs can be generated by using a CW laser combined with a micro-ring resonator. Comb production is based on parametric mixing and a balancing of the linear dispersion with the waveguide dispersion. This can generate combs on a wide grid (~1 THz) but with coherent properties that are difficult to predict and control. Some key challenges with the micro-resonator approach are: the need for a stabilized CW laser with Hz level linewidths and watt level output power. The initial conditions on the input CW laser and state of the resonator determine the quality of the coherence of the comb. These initial conditions have been termed as chaotic by theorists working in the area. Finally, one must either tune the CW laser or the ring so they are resonant with each other. Once either of the two references becomes tunable, one immediately sacrifices the stability thus limiting the ability for the generation of low noise RF signals.

Frequency combs can be generated by passing a CW laser through a series of amplitude and phase modulators using an RF signal that defines the comb spacing. In this approach, the RF noise is directly impressed on the combs, and the comb linewidth increases with wider comb bandwidth. There is nothing in this approach that filters the RF noise.

Optical frequency combs can be produced by sending two CW lasers into a nonlinear optical fiber. The parametric processes of four wave mixing will cascade, producing a frequency comb with a spacing equal to the frequency spacing of the two CW sources. The key challenges with this approach is that one needs two CW lasers with Hz level linewidths and the nonlinear optical fiber must be carefully controlled to minimize linewidth broadening mechanisms, e.g., thermal noise, atomic Brownian motion, Brillouin and Raman effects, which will corrupt the four wave mixing/parametric processes.

In view of the aforementioned and other known shortcomings in the art, the inventors have recognized the benefits and advantages of providing apparatus and methods that can generate highly stable, ultra-low noise optical and RF outputs that do not require a separate CW laser and a high finesse etalon or an f-2f interferometer and second harmonic generation stages for stabilization; that can generate high pulse repetition rates directly without the need for interleaving, which leads to unacceptably large RF spurs at harmonics of the repetition rate in the phase noise plot out to Nyquist Frequencies; that can provide wide comb spacing, reducing requirements on filtering that provides for access to individual axial modes, that are easily scalable to higher repetition rates; that utilize octave spanning techniques, which provide inherent long-term stability; that utilize direct electrical pumping and fiber coupling to increase robustness and wall plug efficiency; and which can provide a low noise frequency comb source at 10 GHz and higher in a fieldable (portable; rack-mountable) package. These benefits and advantages, and others, are enabled by the embodied mode-locked laser (MLL) and associated methods described herein below and in the appended claims.

SUMMARY

An aspect of the invention is a mode-locked-laser, particularly and advantageously a MLL that produces ultra-low phase noise optical and RF outputs. An embodiment of the MLL includes a plurality of nested resonant cavities including at least one optical fiber-based cavity and at least one periodic frequency filter cavity; and a three bandwidth Pound-Drever-Hall (PDH) frequency stabilizer assembly that includes at least three different optical bandpass filters, $f_L$, $f_H$, $f_C$, corresponding to a low frequency, a high frequency, and a center frequency, respectively, of an optical output spectrum of the MLL, wherein the at least one optical fiber-based cavity is characterized by a free spectral range, $FSR_{fiber}$, and wherein the at least one periodic frequency filter cavity is characterized by a free spectral range, $FSR_{filter}$, further wherein $FSR_{filter}/FSR_{fiber}$ is an integer equal to or greater than 2. In various non-limiting aspects and embodiments, the MLL may further include and/or incorporate the following components, limitations, features, and/or characteristics alone or in combination as a person skilled in the art would readily understand:

wherein the at least one optical fiber-based cavity further includes a semiconductor optical amplifier (SOA) and a harmonic mode locker component.
  wherein the harmonic mode locker component is at least one of an active harmonic mode locker, a passive harmonic mode locker, and a combination (hybrid) active/passive harmonic mode locker.
    wherein the active harmonic mode locker is an intensity modulator applied to a loss of the laser cavity.
    wherein the active harmonic mode locker comprises an external RF drive signal applied to a gain of the laser cavity.
    wherein the passive harmonic mode locker comprises a non-linear optical element.
      wherein the non-linear optical element is a saturable absorber.
    wherein the passive harmonic mode locker comprises a detector followed by an intensity modulator.
wherein the at least one periodic frequency filter cavity is one of an etalon and a ring resonator.
  wherein the etalon is a Fabry-Perot etalon.
wherein $FSR_{filter}/FSR_{fiber}$ is greater than 1000.
wherein the MLL is characterized by an optical output having an independently controllable center frequency and an independently controllable repetition rate.
  wherein the MLL is further characterized by an RF output having a repetition rate equal to the optical output repetition rate.
wherein the optical output is in the telecommunications C-band.
  wherein the optical output has a center wavelength of 1550 nm.
further comprising a linear or a non-linear medium having an input characterized by a bandwidth, coupled to at least a portion of the optical output, wherein an output of the linear or the nonlinear medium is a spectrum having a bandwidth that is equal to or broader than the bandwidth of the input.
further comprising an intra-fiber-cavity non-uniform group delay dispersion compensator.

wherein the intra-fiber-cavity non-uniform group delay dispersion compensator is a commercial Finisar Waveshaper optical component.

characterized by an optical frequency division factor equal to or greater than 100.

characterized by an optical frequency division factor equal to or greater than 1000.

characterized by an optical frequency division factor equal to or greater than 18000.

characterized by an optical frequency division factor equal to or greater than 30000.

wherein the optical output is an optical comb having a number of comb lines equal to the division factor.

wherein the RF output has a phase noise that is reduced by a factor that is proportional to $(n+m)^2$, where $(n+m)$ is the number of comb lines of the optical output.

wherein the RF output has a phase noise that is less than −100 dBc/Hz at 1 Hz and less than −150 dBc at 10 KHz.

characterized by a physical footprint suitable to be fit into a standard rack mount.

An aspect of the invention is a method for generating ultra-low phase noise optical and RF outputs. An embodiment of the method involves the steps of providing a mode-locked laser (MLL) that includes a plurality of nested resonant cavities including at least one optical fiber-based cavity and at least one periodic frequency filter cavity; and a three bandwidth Pound-Drever-Hall (PDH) frequency stabilizer assembly that includes at least three different optical bandpass filters, $f_L$, $f_H$, $f_C$, corresponding to a low frequency, a high frequency, and a center frequency, respectively, of an optical output spectrum of the MLL, wherein the at least one optical fiber-based cavity is characterized by a free spectral range, $FSR_{fiber}$, and wherein the at least one periodic frequency filter cavity is characterized by a free spectral range, $FSR_{filter}$, further wherein $FSR_{filter}/FSR_{fiber}$ is an integer equal to or greater than 2; controlling the center frequency of the optical output spectrum of the MLL independent of a change of the repetition rate of the optical output spectrum of the MLL; and controlling the repetition rate of the optical output spectrum of the MLL independent of a change of the center frequency of the optical output spectrum of the MLL, wherein the RF output has a phase noise that is reduced by a factor that is proportional to $(n+m)^2$, where $(n+m)$ is the number of comb lines of the optical output. In various non-limiting aspects and embodiments, the method may further include and/or incorporate the following steps, components, limitations, features, and/or characteristics alone or in combination as a person skilled in the art would readily understand:

wherein controlling the repetition rate further comprises generating an error signal from a difference between the low frequency and the high frequency of the optical output spectrum of the MLL.

further comprising increasing a frequency division factor of the MLL to greater than 1000 by generating a mode locked frequency comb.

further comprising providing a linear or a non-linear medium having an input characterized by a bandwidth, coupled to at least a portion of the optical output, wherein an output of the linear or the non-linear medium is a spectrum having a bandwidth that is equal to or broader than the bandwidth of the input.

further comprising compensating for non-uniform group delay dispersion in the at least one optical fiber-based cavity.

comprising adjusting the spectral phase of the optical output.

further comprising flattening a gain profile of the SOA.

The above disclosed, as well as the claimed aspects and embodiments, are exemplary and non-limiting. Other exemplary, non-limiting aspects and embodiments may be disclosed herein and claimed at a later date.

BRIEF DESCRIPTION OF THE DRAWINGS

FIG. 1 schematically illustrates a regenerative mode-locked laser highlighting the different delays and filters that influence the timing jitter and phase noise performance of the MLL, as conventionally known in the art.

FIGS. 2A, 2B illustrates a comparison of the frequency domain pictures of a conventional COEO (FIG. 2A) and an intracavity etalon-based COEO (FIG. 2B).

FIG. 3 is a simplified schematic illustration of a low noise mode-locked laser using optical frequency division to reduce phase noise.

FIG. 4 is a block diagram of the current state of the art (NIST), optical frequency divider using a fiber based optical frequency comb.

FIG. 5 is a comparative block diagram of an embodied approach, showing less components, smaller footprint, and higher wall plug efficiency, according to an illustrative embodiment of the invention.

DETAILED DESCRIPTION OF EXEMPLARY, NON-LIMITING EMBODIMENTS OF THE INVENTION

An embodiment of the invention is a compact optical frequency comb source apparatus (architecture) and associated methods that enable the production of ultralow phase noise RF signals at, e.g., 10 GHz or, substantially any desired frequency. The embodied apparatus and method enable the independent control of both the center frequency and the outer most regions of an optical frequency comb spectrum, so that the optical fluctuations toward the center of the comb spectrum are reduced (divided). The resulting lower noise optical frequency comb components are photodetected, with each neighboring comb pair producing an RF beat contributing to the desired low noise RF tone at the desired output frequency.

Figure 6:
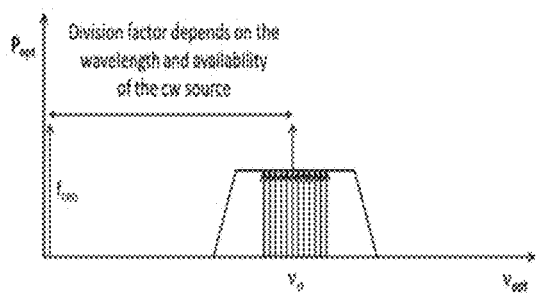
FIG. 6 is a schematic illustration of the limit to the division factor using the current state of the art (NIST) approach.
Figure 7:
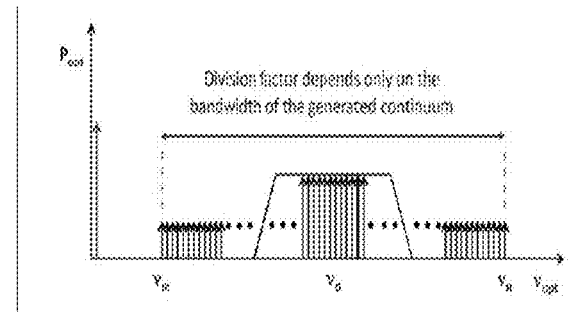
FIG. 7 is a schematic illustration showing that the division factor in an embodied approach is only limited by the continuum bandwidth, according to an illustrative embodiment of the invention.
Figure 8:
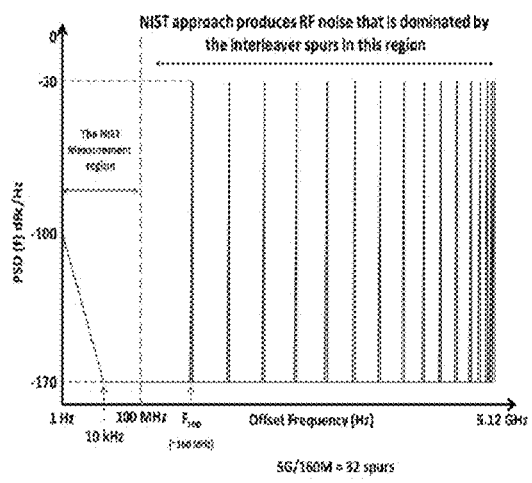
FIG. 8 is a schematic illustration of the generated phase noise spectrum of the current state of the art (NIST) approach, showing the production of large supermode, or interleaver spurs at large offsets, dominating the noise performance.
Figure 9:
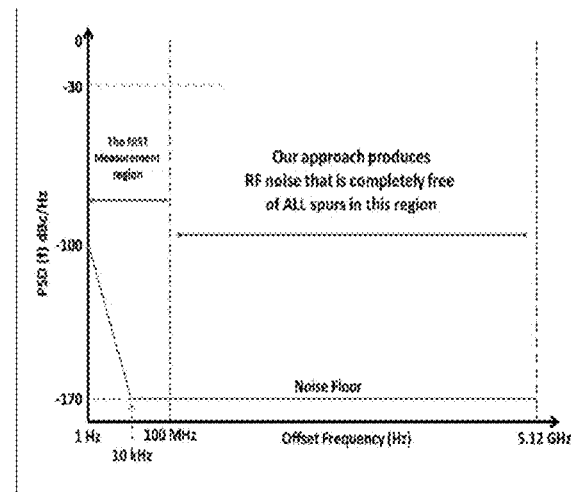
FIG. 9 is a schematic illustration of the generated phase noise spectrum of an embodied approach, showing clean spectra out to the Nyquist offset frequency, according to an illustrative embodiment of the invention.
Figure 10:
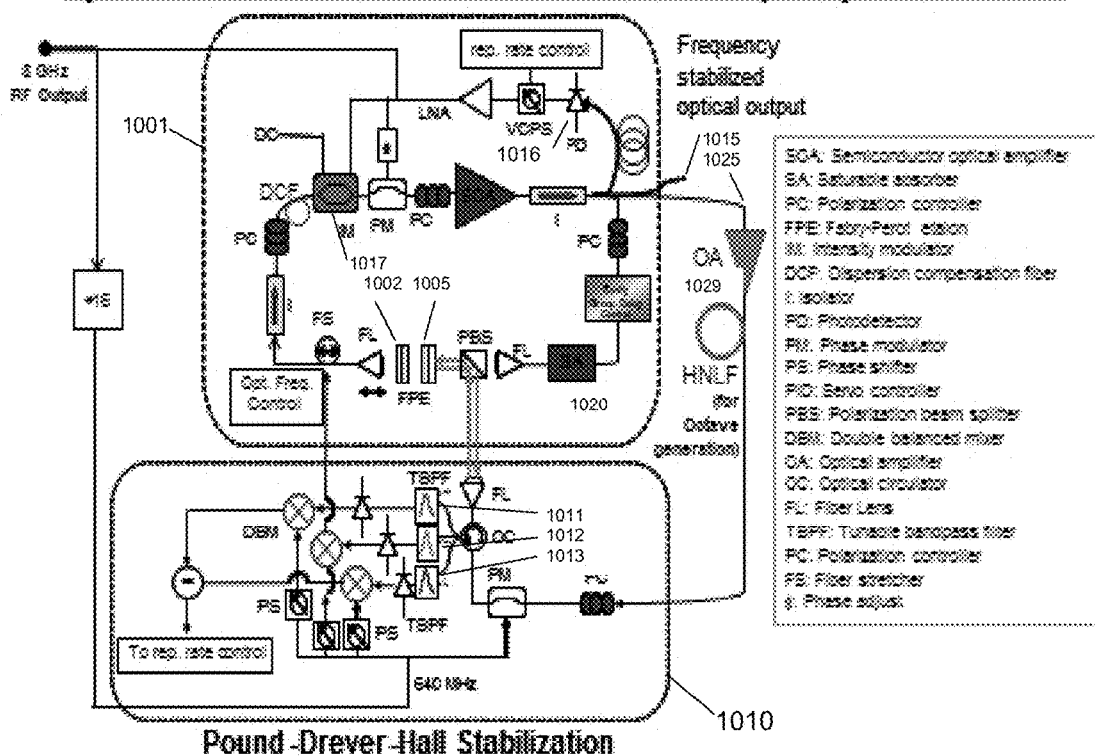
FIG. 10 schematically illustrates a MLL embodied as a hybrid mode-locked, stabilized diode laser frequency comb source, according to an exemplary embodiment of the invention.

FIG. 10 schematically illustrates a MLL 1000 embodied as a hybrid mode-locked, stabilized diode laser frequency comb source. The illustrated MLL 1000 includes two nested resonant optical cavities including optical fiber-based cavity 1001 and a periodic frequency filter cavity 1002 in the form of a Fabry-Perot etalon 1005. The MLL 1000 also includes a three bandwidth Pound-Drever-Hall (PDH) frequency stabilizer assembly 1010 that includes three different optical bandpass filters, $f_L$ 1011, $f_H$ 1012, and $f_C$ 1013, corresponding to a low frequency, a high frequency, and a center frequency, respectively, of an optical output spectrum 1015 of the MLL shown in FIG. 10.

The optical fiber-based cavity 1001 is a 'long' cavity so as to decrease its free spectral range ($FSR_{Fiber}$) since the ratio of the free spectral range of the periodic frequency filter cavity 1002 ($FSR_{filter}$) to the free spectral range of optical fiber-based cavity ($FSR_{filter}/FSR_{Fiber}$) must be an integer equal to or greater than two (2); advantageously greater than 1000 and, more advantageously as large as possible.

The periodic frequency filter cavity 1002 may alternatively be a ring resonator or other suitable periodic frequency filter cavity as known in the art.

The generated RF signal from the diode based frequency comb is proportional to the RF beat note from nearest neighboring tones, represented as $$f_{RF} = v_{k+1} - v_k = f_{rep} + \delta f_{ref} = f_{rep} + \frac{(\delta v_n - \delta v_m)}{(n+m)},$$

which shows that the generated output RF tone is equal to the repetition rate of the mode-locked laser, with frequency fluctuations related to the difference of the frequency fluctuations of the stabilized outermost optical tones, divided by the number of comb lines separating these two tones. In practice this effect, known as optical frequency division, can produce dividing factors of several tens of thousands. In a prototype demonstration, the embodied apparatus and method enabled a reduction in the noise by ~85 dB giving a dividing factor of 18,750.

Figure 11:
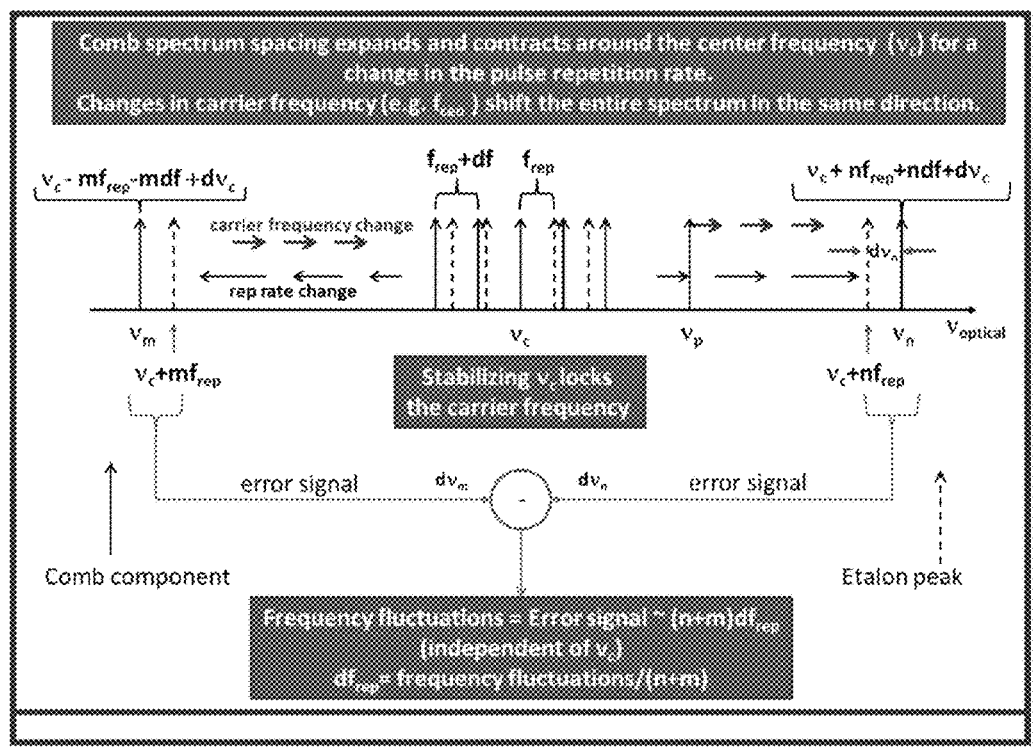
FIG. 11 schematically illustrates the concept of optical frequency division using an etalon based regeneratively mode-locked laser, according to an illustrative embodiment of the invention.

The embodied approach utilizes a three-point Pound-Drever-Hall (PDH) feedback 1010 to stabilize the laser. In the current state of the art (NIST) approach, which is a purely actively mode-locked laser, only the average optical frequency is stabilized since the comb spacing, or repetition rate, is slaved to the RF oscillator. In the embodied etalon-based COEO, the comb spacing is a free parameter that can also be stabilized, which requires a separate feedback loop. By taking the difference between two error signals derived from any two comb components, e.g., n, p from the optical spectrum, a signal that is proportional to only the repetition rate can be obtained (see FIG. 11). Referring to FIG. 11, consider the $n^{th}$ comb line of a mode-locked laser, represented as $$v_n = v_c + n f_{rep}, \qquad (eq. 1)$$

where $v_c$ is the optical carrier frequency and $f_{rep}$ is the pulse repetition rate, or comb spacing. The PDH error signal voltage V is proportional to the deviation of the laser mode from the transmission peak of the etalon:

$$V \propto \delta v_n = \delta v_c + n \delta f_{rep}. \qquad (eq. 2)$$

If another error signal is generated from the $p^{th}$ mode, the difference between the error signals is $$V_1 - V_2 \propto \delta v_n - \delta v_p = (n-p) \delta f_{rep}. \qquad (eq. 3)$$

Thus the difference in error signals is independent of changes to the optical carrier frequency and can be used to independently control the pulse repetition rate.

Referring to FIG. 10, the laser 1000 is hybridly (actively and passively) mode-locked operating at 1550 nm, using a semiconductor optical amplifier as the gain element, a semiconductor saturable absorber as a passive mode-locking mechanism, and an active or regenerative mode-locking signal generated from the photodetected output to drive an intracavity modulator. An intracavity etalon 1005, comprised of 'ultralow expansion quartz' (ULE) is incorporated inside the laser cavity (finesse~1E4-1E5, $FSR_{ET4}$~8 GHz). The role of the ULE etalon is twofold: 1) to select a single grouping of axial modes from the extended optical fiber cavity (mode spacing~1 MHz) to eliminate both electrical and optical supermode noise, and 2) to serve as the secondary optical reference that generates error signals for independently stabilizing both the repetition rate ($f_{rep}$) and the optical comb center frequency ($v_c$). It is these two features that enable this laser to be used as an optical frequency divider without the need of an f-2f interferometer and second harmonic doubling crystals to stabilize the carrier offset frequency, and without the need for a separate CW laser locked to a high finesse etalon, providing ultralow phase noise in a low weight, portable package with higher wall plug efficiency.

Again referring to FIG. 10, the laser 1000 is started through a saturable absorber 1020, producing pulses that are filtered with the intracavity etalon 1005. This generates axial modes on an 8 GHz grid. The output pulse train is photodetected (at 1016) and the resulting signal is applied to an intracavity intensity modulator 1017, providing additional stability to the generated pulse train. For this to be stable, the optical fiber cavity 1001 (FSR~1 MHz) must be stabilized and be harmonically related to the FSR of the etalon 1005. This is achieved by using the three-point intracavity Pound-Drever-Hall stabilization approach (1010). A portion 1025 of the output of the mode-locked laser is tapped, phase modulated, and re-injected into the laser cavity. The phase modulated light is reflected from the intracavity etalon 1005. The reflected light is separated using three bandpass filters 1011, 1012, 1013: two filters pass light at opposite ends of the laser spectrum (denoted $v_H$ and $v_L$ representing the high and low frequency regions of the spectrum) and one filter passes light near the center of the spectrum, $v_c$, which we call the carrier center frequency (this frequency is where the changes in repetition frequency are canceled by changes in the carrier frequency, also referred to as the "fixed-point" frequency). These three error signals are the necessary and sufficient signals to decouple and independently control the center frequency and the mode spacing, allowing us to realize optical frequency division for low noise RF signal generation.

This laser is hybridly mode-locked and the optical frequency combs are created and referenced to near the center optical frequency; i.e., the "fixed point" is near the center of the optical spectrum for an active/hybrid MLL and, as a result, changes in the repetition rate 'breathe' around this frequency. This is in contrast to a purely passive mode-locked laser that has its fixed point near D.C. Thus, by deriving an error signal from reflected light in the center of the spectrum, i.e., near the fixed point frequency, we can stabilize the center frequency independent of changes to the repetition rate.

Control of the repetition rate, independent of changes to the center frequency can be achieved by taking the difference of the two outer error signals, as will be described in detail below.

The embodied approach can be mathematically described by noting that the optical frequency of the $n^{th}$ comb line is given by $$v_n = v_c + n f_{rep}, \quad (eq.\ 4)$$

where $v_c$ is the carrier (or center frequency), where changes in the rep rate appear to 'breathe' around this frequency. Fluctuations in this comb line can be represented as a combination of fluctuations in the center frequency plus fluctuation in the repetition rate, i.e., $$\delta v_n = \delta v_c + n \delta f_{rep}. \quad (eq.\ 5)$$

These fluctuations can be measured using the error signals produced by the outer most comb lines reflecting from the etalon. By taking the difference of these two error signals, one gets $$\delta v_n - \delta v_m = (n+m) \delta f_{rep}, \quad (eq.\ 6)$$

where m and n are the positions of the comb components at the outermost spectral regions of the mode-locked laser. This shows that the error signal generated from the difference of the two comb lines are independent of fluctuations in the carrier frequency, and only represent fluctuations in the repetition rate. As a result, this signal serves as a feedback control signal that only influences the repetition rate, and hence, the RF phase noise.

In (eq. 6), it is the factor, (n+m) that gives one the ability to divide down and reduce the RF phase noise in the mode-locked laser repetition rate. For example, fluctuations in the repetition rate become $$\delta f_{rep} = (\delta v_n - \delta v_m)/(n+m). \quad (eq.\ 7)$$

To generate low noise RF signals, recall that an RF signal is comprised of a coherent sum of all possible beat notes of neighboring optical comb components in the mode-locked laser. Considering two nearest neighbor axial modes, these two optical frequencies are given by $$v_k = v_c + k f_{rep} + k \delta f_{rep} \quad (eq.\ 8)$$

and $$v_{k+1} = v_c (k+1) f_{rep} + (k+1) \delta f_{rep}. \quad (eq.\ 9)$$

The RF beat note is just the difference of these two tones, or $$f_{RF} = v_{k+1} - v_k = f_{rep} + \delta f_{rep} = f_{rep} + (\delta v_n - \delta v_m)/(n+m). \quad (eq.\ 10)$$

This shows that the generated output RF tone, in the case of selecting neighboring optical frequency comb components, is just equal to the repetition rate of the mode-locked laser, with frequency fluctuations equal to the difference of the frequency fluctuations of the stabilized optical tones, divided by the number of comb-lines separating these two tones.

Advantageously, one wants to make this factor as big as possible to generate a mode-locked frequency comb with as wide an optical bandwidth as possible. To achieve this, the optical output can be amplified and passed through a highly nonlinear fiber 1029 (FIG. 10) to generate a supercontinuum, advantageously spanning at least an optical octave. The output is then phase modulated and re-directed into the laser cavity and reflected from the intracavity etalon, thus allowing for the selection of comb components at increasingly wider separation, increasing the division factor. For an exemplary 8 GHz mode-locked laser centered at 1550 nm with spectral components extending from 1 um to 2 um (150 THz bandwidth), one realizes a division factor of 18,750, thus providing a noise reduction of ~−85 dB.

Figure 12:
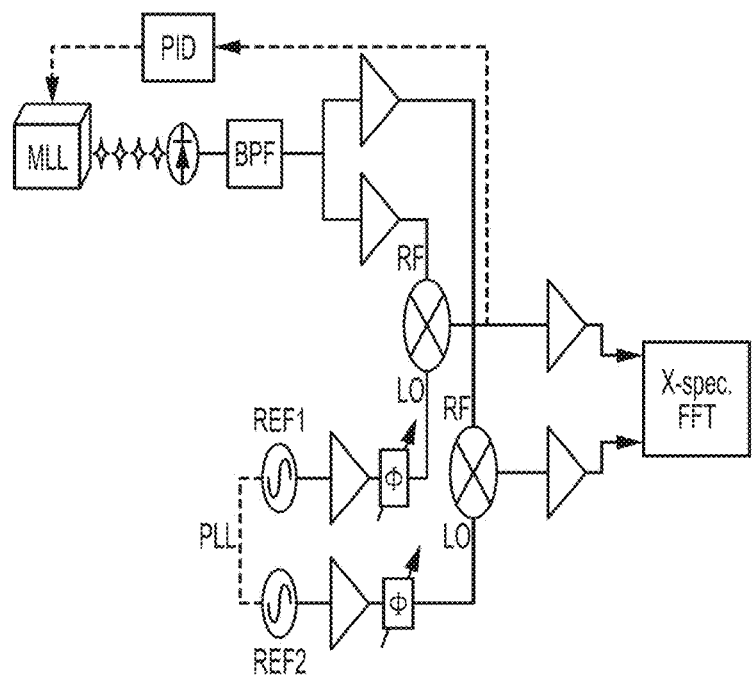
FIG. 12 schematically illustrates the experimental setup for a cross-spectrum measurement technique to achieve the ultra-low noise floor, according to an illustrative embodiment of the invention.
Figure 13:
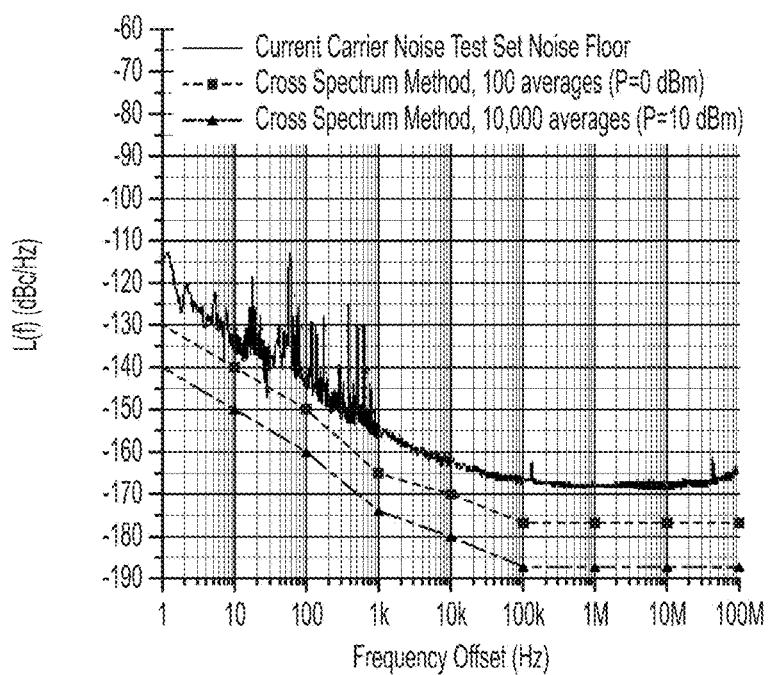
FIG. 13 graphically illustrates achieved and projected noise floor performance.

To achieve the desired phase noise goals, precision measurement methods should be used to quantify the 'absolute' phase noise. Absolute phase noise is typically obtained if the source under test is referenced to a second source of similar or better quality. We plan to build two mode-locked lasers to measure against each other; however, at this time we used a Poseidon oscillator as a reference source to provide initial phase noise data. To achieve the high sensitivity and lowest measurement noise floors, we used 'cross spectrum' analysis (see FIG. 12). By using two separate sources, e.g., the mode-locked laser and a second reference source (MLL or oscillator), the cross spectrum technique allows noise introduced by mixers and RF amplifiers to be averaged out. Our current measurement noise floor on a 10 GHz carrier is ~−168 dBc/Hz@ 1 MHz offset. With a 10 dBm RF input and 10,000 averages, the measurement noise floor was reduced to ~−188 dBc/Hz@ 1 MHz offset (see FIG. 13).

Importantly, the total dispersion of the composite fiber cavity should advantageously possess a flat group delay across as wide an optical spectrum as possible, to generate the widest possible comb directly from the laser. For a system operating at 1550 nm, this would imply flat group delay across the telecommunication "C" band. To achieve this, a commercially available programmable dispersion compensator can be used intracavity to compensate for non-uniform group delay. We used a Finisar Waveshaper optical component, which is a fiberized device that operates by spatially separating the optical spectrum and passing the spatially dispersed spectrum through a liquid crystal spatial light modulator to provide complete control of the spectral magnitude and phase of the transmitted light. By adjusting the spectral phase of the device, the dispersion of the optical fiber cavity can be compensated, resulting in 'flat group delay."

The total dispersion in the high finesse etalon should also possess flat group delay across the widest possible spectrum. This can be achieved by constructing an etalon that uses octave reflective coatings with flat group delay with ULE (ultra-low expansion) quartz spacers. Octave spanning mirrors with flat group delay have been developed for Ti:Al$_2$O$_3$ lasers. Extension of this concept to the telecom C band is straightforward and are commercially available.

The generation of a coherent octave spanning spectrum from a high repetition rate diode source is challenging since the peak power is typically insufficient. This can be solved by: a) a further reduction in the generated optical pulse duration using pulse compression techniques, e.g., dispersion compensation, and b) reduction in the threshold for nonlinear continuum generation. The reduction in nonlinear threshold is achievable by using nonlinear fiber tapers based on chalcogenide fibers. We have recently demonstrated that the peak power necessary for generating an optical octave centered at 1550 nm is 3 kW, which would be achievable with 100 fs pulses at 10 GHz with 3 watts of average power. The two approaches of pulse width reduction and use of nonlinear fiber tapers may be sufficient for coherent octave spanning continuum generation. An alternate approach is to optically "pulse-pick' to temporally demultiplex the 8 GHz pulse train to 1 GHz and use conventional highly non-linear fibers. The reduced pulse rate would increase the peak power by tenfold, allowing the use of conventional fibers.

Figure 14:
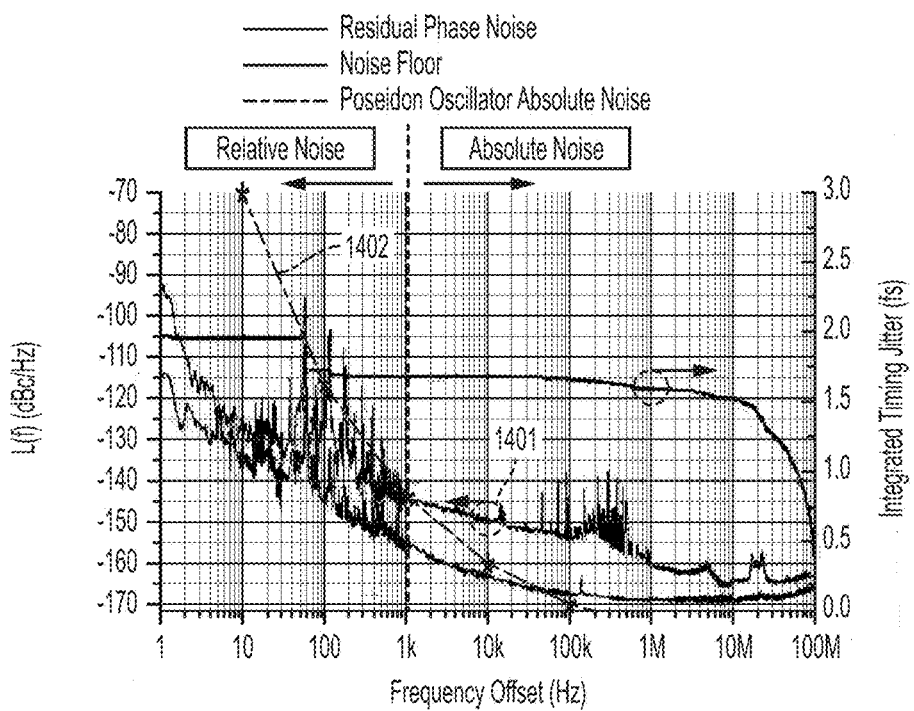
FIG. 14 graphically illustrates a single sideband phase noise plot of a demonstrated low noise stabilized semiconductor diode frequency comb source, according to an illustrative embodiment of the invention.

FIG. 14 shows our current phase noise performance 1401 of a 10 GHz stabilized optical frequency comb (blue trace), along with a plot of a 10 GHz Poseidon oscillator 1402. The laser being measured is an actively mode-locked stabilized optical frequency comb and is driven by a Poseidon oscillator. The noise measurement is performed by photodetecting the pulse train and comparing the fluctuation against the Poseidon oscillator. For offset frequencies below 1 kHz, the measured noise is lower than the Poseidon, which means the measured phase noise is relative to the Poseidon (the absolute noise of the laser is identical to the Poseidon in this region). Above 1 kHz, the measured noise is greater than the Poseidon, thus showing the absolute noise performance of the laser.

Figure 15A:
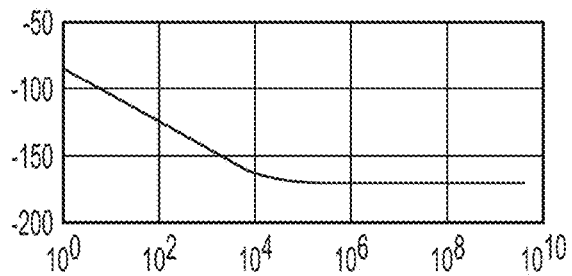
FIG. 15A) Single Sideband Phase Noise Power Spectral Density (dBc/Hz) vs Offset Frequency (Hz)
Figure 15B:
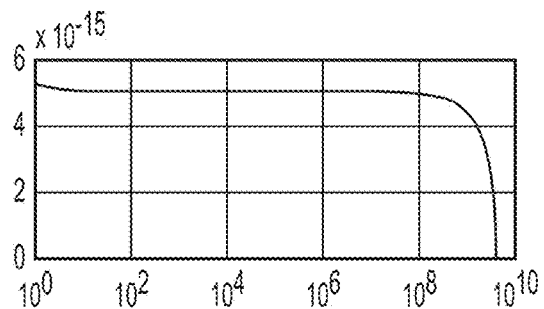
FIG. 15B) Integrated Jitter (seconds) vs Offset Frequency (Hz).

The calculated, expected phase noise performance for our approach is shown in FIGS. 15A, 15B, in which the top plot shows single sideband phase noise power spectral density (dBc/Hz) vs. offset frequency (Hz) and the bottom plot shows integrated jitter (seconds) vs. offset frequency (Hz). The calculation was performed assuming an RF beat note linewidth of 1 Hz and a Lorentzian RF lineshape. In our approach, a division factor of 18,750 corresponds to an optical octave of bandwidth, centered at 1550 nm, extending from 1 um to 2 um. A 1 Hz comb linewidth was expected and justified since 1 Hz level linewidth CW lasers are achieved by locking a laser to an etalon with finesse of 100,000, which is the same finesse of the etalon used in our demonstration mode-locked laser.

Figures 16A, 16B, 16C, 16D:
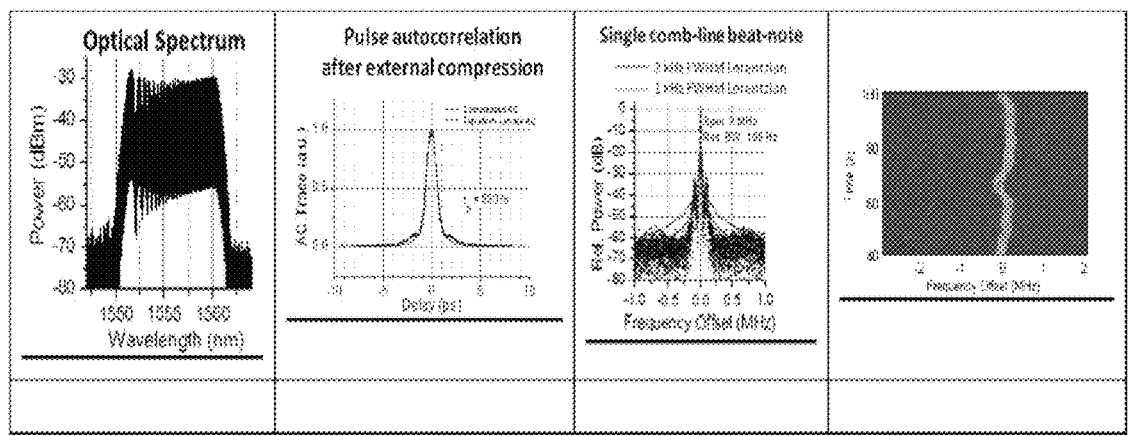
FIG. 16A: Comb spectrum.
FIG. 16B: Intensity autocorrelation.
FIG. 16C: linewidth.
FIG. 16D: frequency drift, according to illustrative embodiments of the invention.

The output characteristics of a demonstrated apparatus are shown and summarized in FIG. 16, showing (FIG. 16A) the optical frequency comb spectrum (~10 nm with 125 comb components), (FIG. 16B) an intensity autocorrelation pulse width of ~930 fs, (FIG. 16C) an axial mode (comb tooth) linewidth of ~1 kHz, and (FIG. 16D) long term frequency drift (due to large environmental (lab) perturbations, such as opening lab the door, inducing pressure changes) of 300 kHz.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As may be used herein and in the appended claims for purposes of the present disclosure, the term 'about' means the amount of the specified quantity plus/minus a fractional amount of or reasonable tolerance thereof that a person skilled in the art would recognize as typical and reasonable for that particular quantity or measurement. Likewise, the term 'substantially' means as close to or similar to the specified term being modified as a person skilled in the art would recognize as typical and reasonable as opposed to being intentionally different by design and implementation.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

We claim:

1. A mode-locked laser (MLL) that produces ultra-low phase noise optical and RF outputs, comprising:
   a plurality of nested resonant cavities including: at least one optical fiber-based cavity, and at least one periodic frequency filter cavity; and a three bandwidth Pound-Drever-Hall (PDH) frequency stabilizer assembly that includes at least three different optical bandpass filters, $f_L$, $f_H$, $f_C$, corresponding to a low frequency, a high frequency, and a center frequency, respectively, of an optical output spectrum of the MLL,
   wherein the at least one optical fiber-based cavity is characterized by a free spectral range, $FSR_{fiber}$, and
   wherein the at least one periodic frequency filter cavity is characterized by a free spectral range, $FSR_{filter}$,
   wherein $FSR_{filter}/FSR_{fiber}$ is an integer equal to or greater than 1000,
   wherein the at least one periodic frequency filter cavity is one of an etalon and a ring resonator,
   wherein the etalon is a Fabry-Perot etalon, wherein at least one optical fiber-based cavity further includes:
   a semiconductor optical amplifier (SOA), and
   a harmonic mode locker component,
   wherein the harmonic mode locker component is at least one of an active harmonic mode locker, a passive harmonic mode locker, and a combination (hybrid) active/passive harmonic mode locker,
   wherein the active harmonic mode locker comprises:
   an intensity modulator applied to a loss of the laser cavity and/or an external RF drive signal applied to a gain of the laser cavity, wherein the passive harmonic mode locker comprises: a non-linear optical element and/or a detector followed by an intensity modulator.

2. The MML of claim 1, wherein the non-linear optical element is a saturable absorber.

3. The MML of claim 1, wherein the MLL is characterized by an optical output having an independently controllable center frequency and an independently controllable repetition rate.

4. The MML of claim 3, wherein the MLL is further characterized by an RF output having a repetition rate equal to the optical output repetition rate.

5. The MML of claim 1, wherein the optical output is in the telecommunications C-band.

6. The MLL of claim 5, wherein the optical output has a center wavelength of 1550 nm.

7. The MML of claim 1, further comprising a linear or a non-linear medium having an input characterized by a bandwidth, coupled to at least a portion of the optical output, wherein an output of the linear or the nonlinear medium is a spectrum having a bandwidth that is equal to or broader than the bandwidth of the input.

8. The MML of claim 1, further comprising an intra-fiber-cavity non-uniform group delay dispersion compensator.

9. The MML of claim 8, wherein the intra-fiber-cavity non-uniform group delay dispersion compensator is a commercial Finisar Waveshaper optical component.

10. The MLL of claim 1, characterized by an optical frequency division factor equal to or greater than 100.

11. The MLL of claim 10, characterized by an optical frequency division factor equal to or greater than 1000.

12. The MLL of claim 10, characterized by an optical frequency division factor equal to or greater than 18000.

13. The MLL of claim 10, characterized by an optical frequency division factor equal to or greater than 30000.

14. The MLL of claim 10, wherein the optical output is an optical comb having a number of comb lines equal to the division factor.

15. The MLL of claim 1, wherein the RF output has a phase noise that is reduced by a factor that is proportional to $(n+m)^2$, where $(n+m)$ is the number of comb lines of the optical output.

16. The MLL of claim 1, wherein the RF output has a phase noise that is less than −100 dBc/Hz at 1 Hz and less than −150 dBc at 10 KHz.

17. The MLL of claim 1, characterized by a physical footprint suitable to be fit into a standard rack mount.

* * * * *